United States Patent [19]

Wilensky

[11] 3,815,121

[45] June 4, 1974

[54] CURRENT MODE DIGITAL-TO-ANALOG CONVERTER

[75] Inventor: Samuel Wilensky, Waltham, Mass.

[73] Assignee: Hybrid Systems Corporation, Burlington, Mass.

[22] Filed: Dec. 1, 1972

[21] Appl. No.: 311,268

[52] U.S. Cl. .......... 340/347 DA

[51] Int. Cl. .......... H03k 13/02

[58] Field of Search .......... 340/347 DA

[56] References Cited

UNITED STATES PATENTS

| | | | |
|---|---|---|---|
| 3,182,181 | 5/1965 | Schumann | 340/347 DA |
| 3,328,792 | 6/1967 | Stone et al. | 340/347 DA |
| 3,400,257 | 9/1968 | Smith | 340/347 DA |
| 3,581,303 | 5/1971 | Kelly | 340/347 DA |
| 3,611,353 | 10/1971 | Shipp et al. | 340/347 DA |

*Primary Examiner*—Thomas A. Robinson
*Attorney, Agent, or Firm*—Weingarten, Maxham & Schurgin

[57] ABSTRACT

A digital-to-analog converter of relatively simplified design for ease of fabrication in discrete, hybrid or integrated circuit modes and consisting of a plurality of resistor-diode circuits connected in parallel across a voltage reference through the emitter-base junction of a current summing transistor. Available at the transistor collector is an analog representation of the digital input applied through respective switching diodes to the junction between the resistor and diode in each of the plurality of parallel circuits.

7 Claims, 2 Drawing Figures

CURRENT MODE DIGITAL-TO-ANALOG CONVERTER

FIELD OF THE INVENTION

This invention relates to digital-to-analog converters and in particular to a current mode digital-to-analog converter of simplified construction.

BACKGROUND OF THE INVENTION

With the growing demand for systems which combine both digital and analog signal processing there is an increasing demand for simple and reliable circuits to provide the conversion between digital and analog signal formats at low cost such that system efficiency is not impaired by the requirement of multiple conversion between the two formats. The digital-to-analog converter portion of that bidirectional conversion requirement has been accomplished for years in many varied configurations. In recent years the technology of circuit miniaturization, taking advantage of hybrid and integrated circuit concepts, has not only reduced the size of many systems but also reduced the cost of fabrication and simplified the manufacture. The digital-to-analog converter, having an inherently large number of parts due to the large number of digital input bits which must be accepted for conversion to a unitary, analog signal output would particularly profit from techniques which permit its total or partial fabrication in discrete, hybrid or integrated circuit form according to these new technologies.

BRIEF SUMMARY OF THE INVENTION

This object of miniaturization and simplified fabrication is achieved with a digital-to-analog converter according to the present invention which provides at least eight or 10 bit resolution where applications exist for that number of bits or for use as the lower order bits of a higher order conversion system. In particular implementation the digital-to-analog converter comprises a plurality of resistor-diode series connected legs which are in turn connected in parallel across a temperature compensated voltage reference to the emitter-base junction of a current summing transistor. A summed current output taken from the transistor's collector provides a current magnitude representative of the digital input signal. The digital input is applied through a further plurality of diodes to the junction between each resistor and diode in the plurality of parallel legs and operates as a current switch to divert the current through the resistor away from the current summing junction of the transistor.

All but the resistors of the circuit are inherently capable of fabrication together using advanced processing techniques or integrated circuit technology to reduce the cost and simplify production of the converter.

BRIEF DESCRIPTION OF THE DRAWINGS

These and other features of the present invention will be more clearly described below in a detailed description of the preferred embodiments presented for purposes of illustration, and not by way of limitation, and in the accompanying figures of which.

DETAILED DESCRIPTION OF THE PREFERRED EMBODIMENTS

Figure 1:
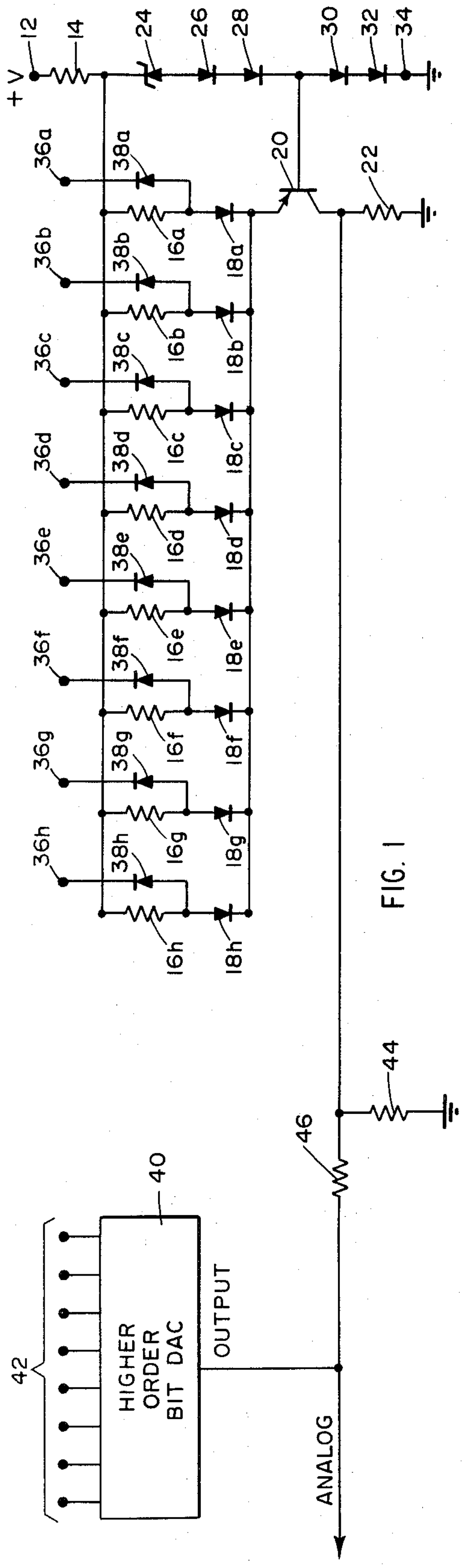
FIG. 1 is a schematic diagram of an eight bit resolution digital-to-analog converter according to the invention optionally operative as the lower order bits of a system of higher order conversion.

By reference to FIG. 1 of the drawings a schematic diagram of a digital-to-analog converter according to the invention is shown and provides at least 8 bit resolution in a form which inherently permits simplified fabrication. In particular, a terminal 12 having the voltage output of a voltage source of typically 12–15 volts is connected through a resistor 14 to a common terminal for a plurality of parallel connected resistor-diode series circuits which include resistors **16*a*–16*h* and their respective series connected diodes 18*a*–18*h*. As indicated, the anode conduction type terminals of each diode 18*a*–18*h* are connected to respective resistors 16*a*–16*h* while the cathodes of the diodes 18*a*–18*h* are connected in common to the emitter of a PNP transistor 20. Optionally, the collector of the transistor 20, which provides an analog current output, may be externally connected to ground through a load resistor 22 by the user to convert the current output to a voltage output. The bias on the base of transistor 20 is provided from the voltage at terminal 12 through resistor 14 and further through a series connection of a Zener diode 24 in the reverse breakdown mode of typically 6.2 volts and through forward conducting diodes 26 and 28 which compensate diodes 18*a*–18*h* and the emitter-base junction of transistor 20. A further pair of series connected, forward conduction diodes 30 and 32, are provided between the base of transistor 20 and a terminal 34, typically ground, to establish a reference voltage of typically 1.3 volts at the base of transistor 20** for standard logic levels.

The digital input to the converter is provided as a series of bits in a high or low state on respective terminals **36*a*–36*h* which conduct to the cathodes of respective diodes 38*a*–38*h*. Anodes of diodes 38*a*–38*h* are connected to respective diodes 18*a*–18*h*** at their anodes.

The resistors **16*a*–16*h* increase in resistance in accordance with the significance of the bits with which they are associated through the terminals 36*a*–36*h*. In typical binary code if the terminal 36*a* is the most significant bit, the resistance 16*a* will be the lowest resistance and the resistance of resistors 16*b*–16*h* will each increase by a factor of 2. Other coding formats are possible and, for example, in binary coded decimal the resistor weighting could be 1, 2, 4, 8, 10, 20, 40, 80 in terms of relative values for resistors 16*a*–16*h***.

The transistor 20 acts as a current summing junction for the outputs of the cathodes of the respective diodes **18*a*–18*h* and, because of the relatively constant base-emitter voltage drop of transistor 20, maintains across the 8 parallel legs of series connected resistor-diode combinations a substantially constant voltage as established by the Zener diode 24 and compensating diodes 26 and 28. Further compensation is provided by diodes 30 and 32. The diodes 38*a*–38*h* provide a current switching function so as to direct current from resistors 16*a*–16*h* through the corresponding diodes 18*a*–18*h* when the associated bit is in a high voltage state or through the corresponding diode in the set 38*a*–38*h* when the corresponding associated bit is in the low state. In this manner each of the resistors 16*a*–16*h* maintains essentially the same current at all times to maintain a balanced current drain on the voltage source with the function of the digital input to direct that current into the current summing transistor 20 or to shunt it to the digital driving point of the terminals 36a–36**h.

The output of the transistor 20, having an analog value representing the digital magnitude of the 8 input bits, may be summed with the output of a further digital-to-analog converter 40 having a plurality of higher order bit inputs 42 of higher accuracy. In that case the output of the transistor 20 is adjusted by a shunt resistor 44 and a series resistor 46 to properly scale its values for summing with the output of the higher order bit digital-to-analog converter 40.

Figure 2:
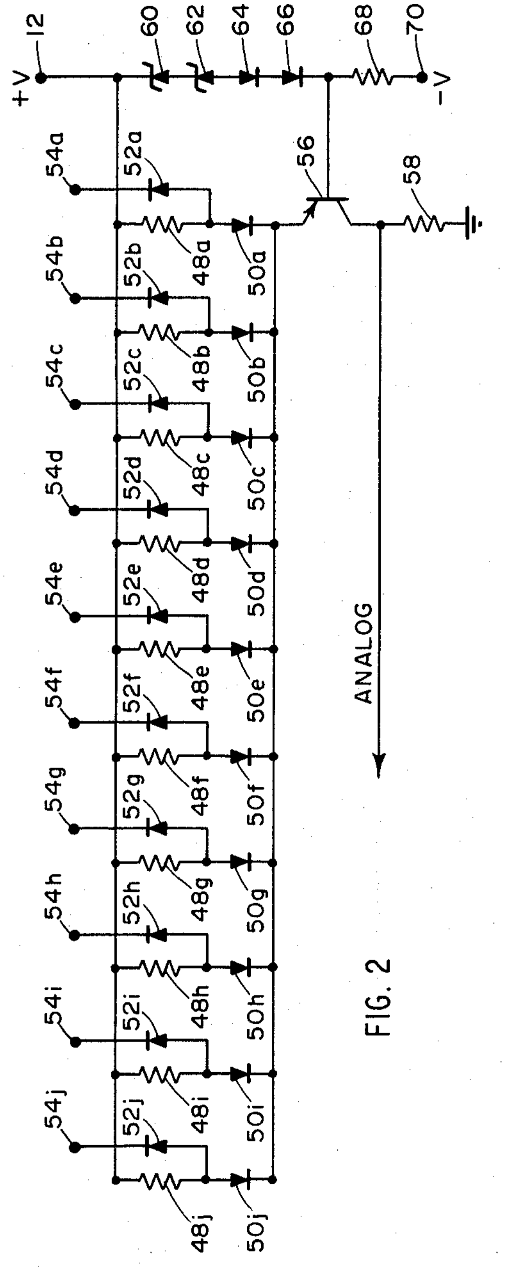
FIG. 2 is a schematic diagram of a modification to the FIG. 1 circuitry.

By reference to FIG. 2, a modification of the system in FIG. 1 is shown which is capable of providing at least a 10 bit resolution. In that case the voltage on the terminal 12 is applied directly to a common point for 10 series connected resistor diode legs, each comprising resistors 48a–48j and diodes 50a–50j. The junction between each of the resistors 48a–48j and each of the diodes 50a–50j is connected through respective diodes 52a–52j to the 10 bit digital inputs 54a–54j. To provide the current switching effect as indicated above, the cathode of the diodes 50a–50j are connected in common to the emitter of a current summing transistor 56 as indicated in FIG. 1. The collector current of transistor 56 is used as the analog current output or applied through an external load resistor 58 to ground to provide a voltage output. The base of transistor 56 is biased from the terminal 12 through series connected Zener diodes 60 and 62 which are both connected in a reverse breakdown orientation at typically 6.2 volts each and further through series diodes 64 and 66 in a forward conduction direction for compensation as described above to properly bias the base of transistor 56. A resistor 68 connects the base 56 to a negative potential terminal 70. In this configuration the resistors 48a–48j have a greater voltage drop to reduce the effect of voltage drops in diodes 50a–50j. The voltage at terminal 12 will typically be a regulated 15 volts.

It can be appreciated that with the exception of the resistors 14 and 16a–16h in FIG. 1 and 48a–48j and 68 in FIG. 2, and optional resistors 22 and 58, the circuitry of the present digital-to-analog converter comprises solid state junction devices which may be readily manufactured using either discrete components or integrated circuit technology in a limited number of processing steps to inexpensively and reliably produce at least eight or 10 bits of accurate resolution. The resistors employed in the converter may be connected as discrete components or thick film depositions which can be accurately adjusted as found desirable.

It is of course clear that the circuit of FIG. 2 may be used with an additional converter such as converter 40 shown in FIG. 1, or that the polarities and conductivity types in the semiconductor elements in the two circuits may be changed. These and other modifications which will occur to those skilled in the art may be made to the invention without departing from its spirit and accordingly it is intended to limit its scope only as indicated in the following claims.

What is claimed is:

1. A digital-to-analog converter comprising:

a voltage source;

a plurality of resistors having ascending orders of resistance values each connected with one terminal in common to receive current from said source at said common terminal;

a first plurality of diodes each having one terminal of the same conduction type connected in common and further having the opposite terminal of each of said first plurality of diodes connected to a respective terminal of said plurality of resistors other than the common terminal of said plurality of resistors;

a second plurality of diodes each connected between digital bit inputs and a respective junction between one of said plurality of resistors and one of said first plurality of diodes with the same conductivity type terminal of each diode in said first and second pluralities of diodes connected together;

a transistor having the emitter thereof connected to said common terminal of said first plurality of diodes and being of a conductivity type for receiving current from said first plurality of diodes in the emitter-base and emitter-collector circuit of said transistor;

means for biasing the base of said transistor with respect to said source to provide operation of said transistor in a current summing mode and to provide a controlled voltage across said plurality of resistors and said first plurality of diodes;

said biasing being at a level to cause said plurality of resistors to provide a substantially identical current to a corresponding one of said first or second plurality of diodes depending upon the state of the corresponding bit input; and means for providing an analog output from the collector of said transistor.

2. The digital-to-analog converter of claim 1 further including means for compensating base bias for variations in said first plurality of diodes and the emitter-base junction of said transition.

3. The digital-to-analog converter of claim 1 further including:

a higher order bit digital-to-analog converter; and means for combining the output of said higher order bit digital-to-analog converter with the output of the collector of said transistor to provide a composite analog output signal.

4. The digital-to-analog converter of claim 1 wherein said means for biasing the base of said transitor includes:

a resistor between said voltage source and said common point of said plurality of resistors;

a plurality of voltage dropping diodes between the common point of said plurality of resistors and the base of said transistor for providing the controlled voltage and temperature compensation therein; and one or more further diodes connected between the base of said transistor and a further voltage reference.

5. The digital-to-analog converter of claim 4 wherein there are at least eight of said plurality of resistors and said first and second plurality of diodes.

6. The digital-to-analog converter of claim 1 wherein:

said means for biasing said base of said transistor includes a plurality of diodes connected between said voltage source and said base to provide a temperature compensated predetermined voltage drop at said base; and an impedance between said base of said transistor and a reference.

7. The digital-to-analog converter of claim 6 wherein said plurality of resistors and said first and second pluralities of diodes number at least 10.

* * * * *